United States Patent [19]

Herberg

[11] Patent Number: 4,467,343
[45] Date of Patent: Aug. 21, 1984

[54] THYRISTOR WITH A MULTI-LAYER SEMICONDUCTOR BODY WITH A PNPN LAYER SEQUENCE AND A METHOD FOR ITS MANUFACTURE WITH A {111} LATERAL EDGE BEVELLING

[75] Inventor: Helmut Herberg, Munich, Fed. Rep. of Germany

[73] Assignee: Siemens Aktiengesellschaft, Berlin & Munich, Fed. Rep. of Germany

[21] Appl. No.: 398,561

[22] Filed: Jul. 15, 1982

[30] Foreign Application Priority Data

Sep. 22, 1981 [DE] Fed. Rep. of Germany ....... 3137695

[51] Int. Cl.³ ............................................ H01L 29/74
[52] U.S. Cl. ...................................... 357/38; 357/55; 357/60
[58] Field of Search ........................... 357/38, 55, 60

[56] References Cited

U.S. PATENT DOCUMENTS

| | | | |
|---|---|---|---|
| 3,493,820 | 2/1970 | Rosvold | 357/60 |
| 3,575,644 | 4/1971 | Huth et al. | 357/38 |
| 3,611,554 | 10/1971 | Garrett | 357/38 |
| 3,648,131 | 3/1972 | Stuby | 357/60 |
| 3,697,829 | 10/1972 | Huth et al. | 357/38 |
| 3,925,807 | 12/1975 | Sonntag | 357/38 |
| 3,943,547 | 3/1976 | Nagano et al. | 357/38 |
| 3,986,200 | 10/1976 | Allison | 357/60 |
| 3,987,479 | 10/1976 | Cornu et al. | 357/38 |
| 3,999,211 | 12/1976 | Voss | 357/38 |

FOREIGN PATENT DOCUMENTS 1134019 11/1968 United Kingdom .............. 357/38 E

OTHER PUBLICATIONS

"Thyristor Physics" by Adolph Blicher, Springer-Verlag, New York, 1976, pp. 198–200.
"Semiconductor Power Devices" by S. K. Ghandhi, John Wiley & Sons, London, 1977, p. 81.
"Physics of Semiconductor Devices" by S. M. Sze, 1969, pp. 320–340.

Primary Examiner—Joseph E. Clawson, Jr.
Attorney, Agent, or Firm—Hill, Van Santen, Steadman & Simpson

[57] ABSTRACT

The invention relates to a thyristor with a multi-layer semiconductor body with a pnpn layer sequence which has two boundary surfaces which lie essentially parallel to the pn-junctions between the individual layers. The thyristor has a doubly slanted edge (or dove-tail profile) which can be produced without mechanical work steps. To this end, such boundary surfaces are oriented in the {100} direction and are rectangularly configured and also have lateral limits which proceed parallel to the {100} orientation direction. Respective pairs of lateral surfaces in the {111} orientation direction are obtained by means of an etching process which extend from mutually corresponding, lateral limits of both boundary surfaces. These pairs of lateral surfaces meet in a plane situated between the boundary surfaces and in which the semiconductor body exhibits a minimum cross-sectional surface. The area of employment comprises power thyristors.

8 Claims, 3 Drawing Figures

4,467,343

THYRISTOR WITH A MULTI-LAYER SEMICONDUCTOR BODY WITH A PNPN LAYER SEQUENCE AND A METHOD FOR ITS MANUFACTURE WITH A {111} LATERAL EDGE BEVELLING

BACKGROUND OF THE INVENTION

1. Field of the Invention

This invention relates to a thyristor with a multi-layer semiconductor body with a pnpn layer sequence and also to a method for its manufacture.

2. Prior Art

Thyristors of this type are known, for example, from the book "Thyristor Physics" by a Adolph Blicher, Springer-Verlag, New York, 1976, pages 198 through 200, particularly FIG. 14.1. Thyristors of the type initially cited are disclosed in "Semiconductor Power Devices" by S. K. Ghandhi, John Wiley & Sons, London, 1977, page 81, particularly FIG. 2.34b, the edge of said thyristors being doubly slanted so that, proceeding from the upper and lower boundary surface, it respectively tapers in a direction toward a plane lying between said boundary surfaces. The minimum cross-sectional surface of the thyristor lies in said plane, when this is based only on cross-sections parallel to the pn junctions. One thereby also speaks of thyristors whose edge describes two positive angles with the upper and lower boundary surface, or of thyristors with a dove-tail profile.

The doubly slanted edge of such a thyristor is produced by means of the influence of a sand jet conducted obliquely relative to the boundary surfaces. Subsequently, however, the edge must be subjected to an etching process in order to eliminate the short-circuits which bridge the pn junctions and which arose as a result of such a mechanical processing operation.

SUMMARY OF THE INVENTION

More particularly, the present invention relates to a thyristor having a multi-layer semiconductor body with a pnpn layer sequence which exhibits two boundary surfaces that lie essentially parallel to the pn junctions between the individual layers. The semiconductor body has a rectangular, minimum cross-sectional surface lying parallel to such boundary surfaces. In addition, the invention relates to a method for making such thyristors.

An object of the invention is to provide a thyristor with a multi-layer semiconductor body having a dove-tail profile which can be manufactured in a simple manner, without the processing step of sand blasting.

In accordance with the present invention, the doubly slanted edge of the thyristor semiconductor body can be manufactured only by means of an etching process, without previous sand blasting, and. Such etching manufacture of the edge geometry proceeds in such manner that no edge-side short-circuits occur.

DETAILED DESCRIPTION

Figure 1:
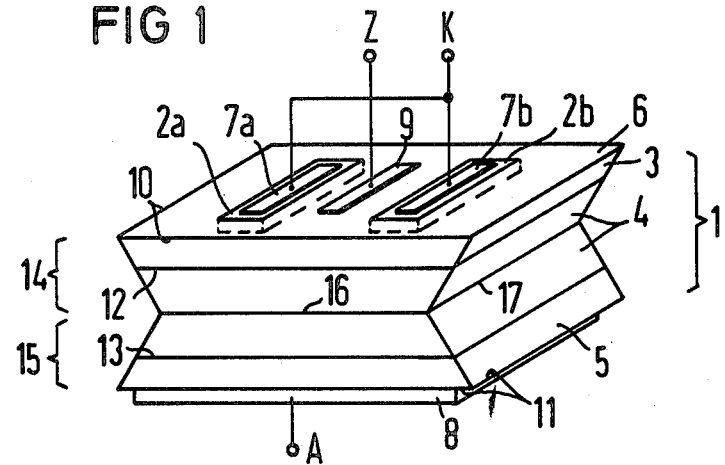
FIG. 1 illustrates in cross-section an embodiment of a thyristor according to the invention.

A thyristor according to the invention is illustrated in FIG. 1 and is seen to have a body 1 consisting of a monocrystalline semiconductor material, for example silicon, which contains n-conductive layers 2a, 2b and 4 and p-conductive layers 3 and 5. The layers 2a, 2b consisting of the two parts 2a and 2b is also referred to as n-emitter; the layer 3 as p-base; the layer 4 as n-base; and the layer 5 as p-emitter. At the boundary surfaces 6 of the semiconductor body 1, the parts 2a and 2b of the n-emitter are provided with two strip-like coatings 7a, 7b consisting of electrically conductive material, for example, aluminum, which together form the cathode of the thyristor and these are connected to a terminal K. The p-emitter 5 is contacted in the opposite boundary surface of the semiconductor body by an anode 8 consisting of electrically conductive material, for example, aluminum. The anode 8 is provided with a terminal A. A trigger electrode 9, which is wired to the terminal Z of an ignition circuit, contacts the p-base 3.

The boundary surface 6 is a {100} direction oriented semiconductor surface. It is rectangularly configured and exhibits lateral limits 10 which proceed parallel to the {100} direction. The surface lying opposite the boundary surface 6 is likewise {100} direction oriented, and rectangularly configured, and exhibits lateral limits 11 which extend parallel to the {110} direction. A pn junction 12 is positioned between the layers 3 and 4 which a pn junction 13 is positioned between the layers 4 and 5. Of the two corresponding, visible, lateral limits or boundary surfaces 10 and 11 which proceed parallel to the plane of the drawing, one pair proceeds for lateral surfaces 14, 15 of the semiconductor body 1 which intersect in a straight line 16 parallel to the boundary surface 6. Analogous thereto, two lateral limits or boundary surfaces which meet in a straight line 17 proceed from the two right lateral surfaces 10 and 11 proceeding obliquely back in FIG. 1. The remaining lateral surfaces 10 and 11 are connected to one another in a corresponding manner by means of respective pairs of lateral surfaces, whereby the two lateral surfaces belonging to each such pair respectively intersect in a plane to which the straight lines 16 and 17 also belong. The semiconductor body 1 exhibits a minimum cross-sectional surface in such plane when one only considers cross-sections parallel to the pn junctions 12, 13. All of the said lateral surfaces, for example, 14 and 15, are respective {111} direction oriented semiconductor surfaces.

The manner of functioning of the thyristor 1 corresponds to that of traditional thyristors and is described, for example, in the book by S. M. Sze "Physics of Semiconductor Devices", John Wiley & Sons, New York, 1969, pages 320 through 340.

Figure 2:
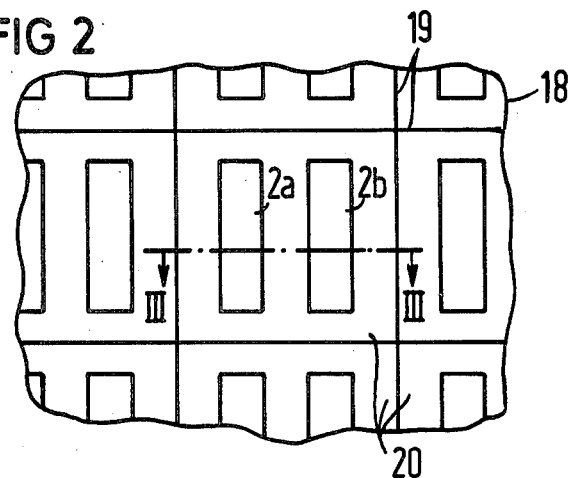
FIG. 2 is a plan view of a wafer-shaped multi-layered semiconductor body from which a plurality of thyristors according to the invention are manufactured.

A part of a monocrystalline, wafer-shaped, multi-layer semiconductor body 18 from which a plurality of thyristors according to FIG. 1 can be manufactured is illustrated in plan view in FIG. 2. Thus, its visible, upper boundary surface is {100} direction oriented, just like the lower boundary surface lying opposite it. At the aforementioned boundary surfaces, the semiconductor body 18 is covered with a masking layer not illustrated in FIG. 2, but which consists, for example, of a material such as silicon nitride ($Si_3N_4$) or $SiO_2$.

Figure 3:
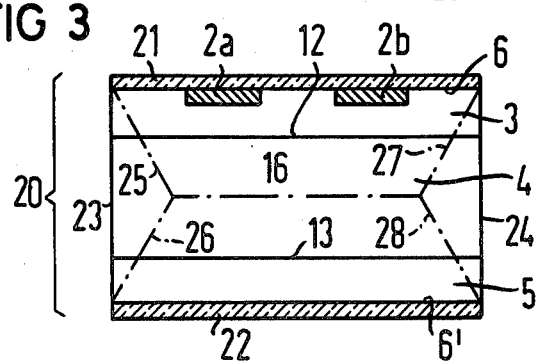
FIG. 3 illustrates an intermediate manufacturing stage achieved in the course of practicing the manufacturing method for making a thyristor of FIG. 1.

When the semiconductor body 18 is divided along parting lines 19 as shown in FIG. 2 which coincide with the {110} direction within the visible boundary surface, then a plurality of cuboid semiconductor pieces 20 arise, one of them being illustrated in FIG. 3. Thus, FIG. 3 shows a cross-section along the line III—III of FIG. 2. The lateral limit of each semiconductor piece 20, which represents an intermediate stage in the manufacture of a thyristor according to FIG. 1, is either rectangular or quadratic.

As follows from FIGS. 2 and 3, each of the identically designed semiconductor pieces 20 exhibits a layer sequence 2a, 2b, 3, 4 and 5 corresponding to FIG. 1. Thereby, the parts 2a and 2b of the n-conductive layer 2a, 2b are strip-like in form and are inserted into p-conductive layer 3 in such a manner that they extend up to the upper boundary surface 6 of the semiconductor piece 20. The longitudinal extent of the strip-shaped parts 2a and 2b is thereby smaller than the dimension or extent of the semiconductor piece 20 in the same direction. The pn junctions 12 and 13 between the layers 3, 4 and 5, which lie essentially parallel to the boundary surface 6 and to the opposite boundary surface 6', are likewise similarly referenced as in the FIG. 1 embodiment. Further, masking layers 21 and 22 (see FIG. 3) cover the upper and lower boundary surfaces of the wafer-shaped semiconductor body 18.

When one of the semiconductor pieces 20 in FIG. 3 is subjected to an anisotropic etching process with an agent which consists, for example, of an aqueous solution of KOH which is heated to approximately 80° C., then a respective V-shaped trough is etched into each of the parting surfaces, for example, surfaces 23 and 24, which are not covered by the masking layers 21 and 22, the wall sections of such troughs being indicated in FIG. 3 with broken lines 25 through 28. Such wall sections represent respective {111} direction oriented semiconductor surfaces and correspond, for example, to the surfaces 14 and 15 in FIG. 1. The wall sections of the V-shaped trough which is etched into the parting surface visible in FIG. 3 and which extends parallel to the plane of the drawing intersect along a straight line 16 indicated with broken lines which correspond to the straight line 16 in FIG. 1.

After the etching process, the masking layers 21 and 22 are removed from the boundary surfaces 6 and 6' and the parts 2a and 2b are provided with coatings 7a and 7b consisting of a metallic, conductive material. After the application of the anode 8 on the layer 5 and of the trigger electrode 9 on the layer 3, as well as of the terminals A, K and Z, a thyristor according to FIG. 1 is produced.

The division of the semiconductor pieces 20 out of the wafer-shaped multi-layer semiconductor body 18 expediently ensues by means of sawing or by means of scanning the surface of the said semiconductor body with the beam of a laser arrangement, for example, a $CO_2$ or NdYAg laser, which is conducted along the parting lines 19. The aperture angle of the thyristors manufactured according to the above procedure and measured between the lateral surfaces, for example, surfaces 14 and 15, and the boundary surfaces 6, or 6', corresponds to 109.5°. The etching time in the manufacture of the V-shaped troughs 25 through 28 can fluctuate within a large tolerance range since the wall sections 25 through 28 are respective {111} direction oriented semiconductor surfaces due to which the etching rate is very low. As a result, the reproducibility of the form of the thyristor semiconductor body 1 illustrated in FIG. 1 is very high.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth in the hereto-appended claims.

I claim:

1. A thyristor having a multi-layer semiconductor body with pnpn layer sequence which exhibits two boundary surfaces that lie essentially parallel to the pn-junctions between the individual layers, wherein said boundary surfaces exhibit a {100} direction orientation, are rectangularly configured, and have lateral limits which extend parallel to a {110} direction orientation; and wherein a plurality of {111} direction oriented pairs of lateral surfaces are provided which each proceeds from mutually corresponding limits of both said boundary surfaces and meets in a plane situated between said boundary surfaces and parallel thereto, in which plane said semiconductor body has a rectangular, minimum cross-sectional surface lying parallel to said boundary surfaces.

2. A method for manufacturing a thyristor of claim 1, wherein a monocrystalline, wafer-shaped multi-layer semiconductor body with a pnpn layer sequence and with two mutually opposite, {100} direction oriented boundary surfaces extending essentially parallel to the pn-junctions between the individual layers is employed, said boundary surfaces being each covered with a masking layer comprising the steps of cutting out of a wafer-shaped multi-layer semiconductor body a multi-layer semiconductor body of a thyristor, said cutting out being conducted along a plurality of prechosen parting surfaces, whereby each of the parting surfaces extends through a parting line which lies in one of said {100} direction oriented boundary surfaces preformed in said wafer-shaped multi-layer semiconductor body and is oriented parallel to a {110} direction orientation, subjecting the multi-layer semiconductor body of such thyristor to an etching procedure in the area of such parting surfaces with an anisotropically effective etching agent, whereby a plurality of V-shaped troughs are etched thereinto whose respective individual wall portions consist of surfaces that are {111} direction oriented and removing said masking layers.

3. The method of claim 2, wherein said wafer-shaped multi-layer semiconductor body consists of silicon.

4. The method of claim 3, wherein said masking layers consist of $Si_3N_4$.

5. The method of claim 3, wherein said masking layers consist of $SiO_2$.

6. The method of claim 2, wherein a solution of potassium hydroxide is employed as said etching agent.

7. The method of claim 2, wherein such separation of said thyristor semiconductor body from said wafer-shaped multi-layer semiconductor body is achieved by sawing.

8. The method of claim 2, wherein such separation of said thyristor semiconductor body from said wafer-shaped multi-layer semiconductor body is achieved by irradiation with a laser beam.

* * * * *